United States Patent
Masenas

(10) Patent No.: US 6,954,088 B2
(45) Date of Patent: Oct. 11, 2005

(54) VOLTAGE CONTROLLED OSCILLATOR (VCO) WITH AMPLITUDE CONTROL

(75) Inventor: Charles J. Masenas, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,177

(22) Filed: Nov. 25, 2003

(65) Prior Publication Data

US 2005/0110528 A1 May 26, 2005

(51) Int. Cl.⁷ .................................................. H03C 3/00
(52) U.S. Cl. ....................... 327/101; 331/36 C; 331/167
(58) Field of Search ................................... 327/101, 113, 327/114, 172, 291; 331/16, 34, 36 R, 36 C, 177 R, 36 L, 177 V, 117 FE, 167, 117 R

(56) References Cited

U.S. PATENT DOCUMENTS

| 6,281,758 | B1 | * | 8/2001 | Elsayed et al. ............... 331/16 |
| 6,426,665 | B2 | * | 7/2002 | Morishita .................... 327/310 |
| 6,445,257 | B1 | * | 9/2002 | Cox et al. ................ 331/117 R |
| 6,593,818 | B2 | * | 7/2003 | Vanselow et al. .............. 331/17 |
| 6,650,096 | B2 | * | 11/2003 | Lee ............................. 323/272 |
| 6,683,509 | B2 | * | 1/2004 | Albon et al. ............ 331/177 V |
| 6,690,244 | B2 | * | 2/2004 | Mernyei et al. ......... 331/117 R |
| 6,727,736 | B1 | * | 4/2004 | Tsang et al. ................. 327/157 |
| 6,774,736 | B1 | * | 8/2004 | Kwek et al. ............ 331/177 V |
| 6,778,022 | B1 | * | 8/2004 | Zhang et al. .................. 331/14 |
| 6,781,471 | B2 | * | 8/2004 | Huang ..................... 331/117 R |

* cited by examiner

Primary Examiner—Timothy P. Callahan
Assistant Examiner—Hai L. Nguyen
(74) Attorney, Agent, or Firm—Schmeiser, Olsen & Watts; Michael LeStrange

(57) ABSTRACT

A structure and associated method for controlling an amplitude of oscillation in a voltage controlled oscillator. The voltage controlled oscillator circuit comprises a drive circuit, an inductor/capacitor (LC) tank circuit, and a diode. The LC tank circuit and the drive circuit collectively comprise a first oscillating node and a second oscillating node. The first oscillating node is adapted to have a first voltage. The second oscillating node is adapted to have a second voltage. The first diode is adapted to control an amplitude of the first voltage and an amplitude of the second voltage.

18 Claims, 4 Drawing Sheets

VOLTAGE CONTROLLED OSCILLATOR (VCO) WITH AMPLITUDE CONTROL

BACKGROUND OF INVENTION

1. Technical Field

The present invention relates to a structure and associated method to control an amplitude of oscillation in a voltage controlled oscillator.

2. Related Art

Electrical circuits are typically required to control electrical signals to operate within specific operating boundaries. An inability to control an electrical signal to operate within specific operating boundaries may cause the electrical circuit to malfunction. Therefore there exists a need to control an electrical signal to operate within a specific operating boundary.

SUMMARY OF INVENTION

The present invention provides a voltage controlled oscillator circuit, comprising:

a drive circuit;

an inductor/capacitor (LC) tank circuit, the LC tank circuit and the drive circuit collectively comprising a first oscillating node and a second oscillating node, the first oscillating node being adapted to have a first voltage, the second oscillating node being adapted to have a second voltage; and a diode adapted to control an amplitude of the first voltage and an amplitude of the second voltage.

The present invention provides a method, comprising:

providing a drive circuit, an inductor/capacitance (LC) tank circuit, and a diode within a voltage controlled oscillator circuit, the drive circuit and LC tank circuit collectively comprising a first oscillating node and a second oscillating node; and controlling by the diode, an amplitude of a first voltage at the first oscillating node and an amplitude of a second voltage at the second oscillating node.

The present invention advantageously provides a structure and associated method to control an electrical signal to operate within a specific operating boundary.

DETAILED DESCRIPTION

Figure 1:
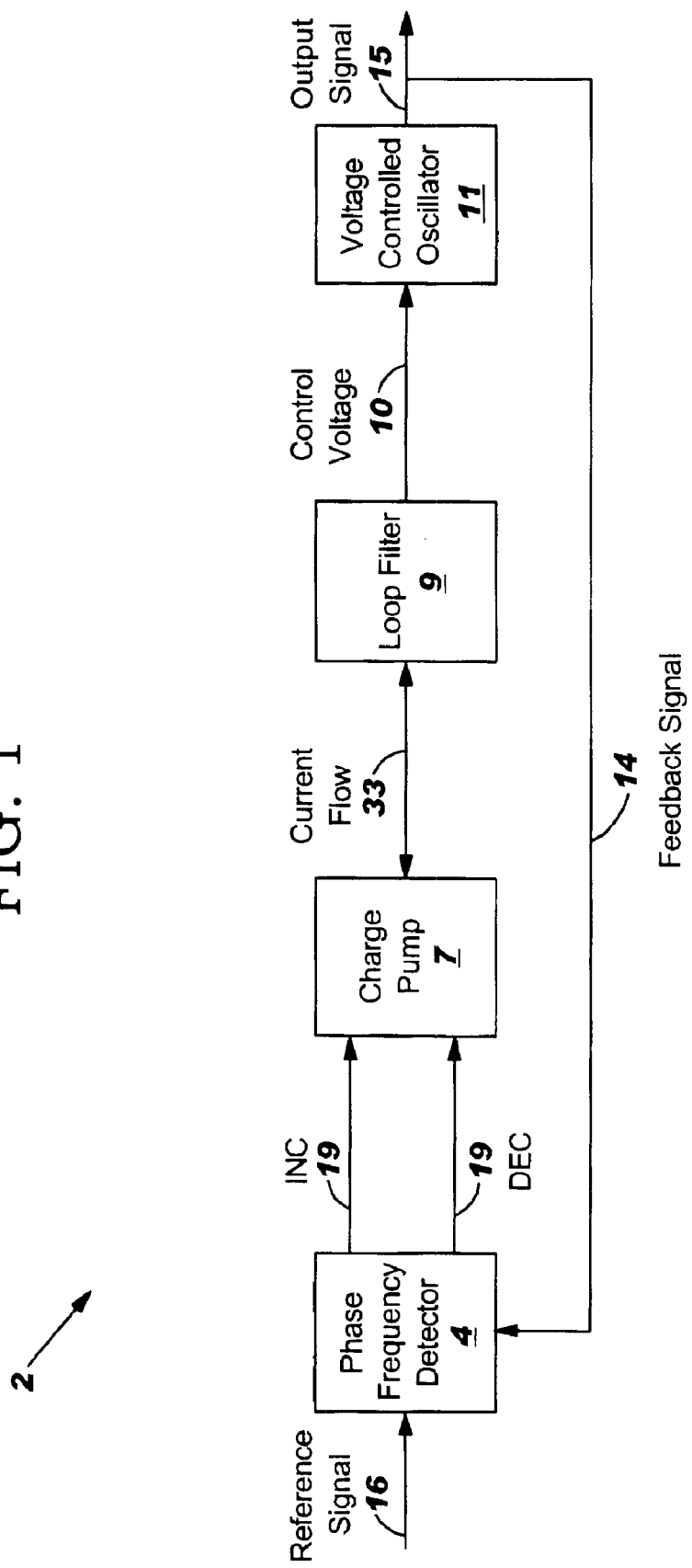
FIG. 1 illustrates a block diagram view of a phase-locked loop (PLL) circuit comprising a voltage controlled oscillator (VCO) circuit, in accordance with embodiments of the present invention.

FIG. 1 illustrates a block diagram view of a phase-locked loop (PLL) circuit 2 comprising a phase frequency detector 4, a charge pump 7, a loop filter 9, and a voltage controlled oscillator (VCO) 11, in accordance with embodiments of the present invention. The phase frequency detector 4 is electrically connected to the charge pump 7. The charge pump 7 is electrically connected to the loop filter 9. The loop filter 9 is electrically connected to the VCO 11. The VCO 11 is electrically connected to the phase frequency detector 4. The phase frequency detector 4 compares a phase and frequency of a reference signal 16 to a phase and frequency of a feedback signal 14 from the VCO 11. The phase frequency detector 4 generates an output comprising an increment (INC) pulse signal 19 and a decrement (DEC) pulse signal 20. The INC pulse signal 19 and the DEC pulse signal 20 represent the phase and frequency difference between the reference signal 16 and the feedback signal 14. The feedback signal 14 is equivalent to the output signal 15. When a phase of the output signal 15 is lagging a phase of the reference signal 16, a pulse width of the INC pulse signal 19 is set wider than a pulse width of the DEC pulse signal 20. When a phase of the output signal 15 is leading of a phase of the reference signal 16, the pulse width of the DEC pulse signal 20 is set wider than the pulse width of the INC pulse signal 19. The INC pulse signal 19 and the DEC pulse signal 20 are transmitted to the charge pump 7. The INC pulse signal 19 and the DEC pulse signal 20 control the charge pump 7 to source or sink a current flow 33 to/from the loop filter 9. Based on an amount and the direction (i.e., source or sink) of the current flow, the loop filter 9 produces a control voltage 10. The control voltage 10 controls the VCO 11 to produce an output signal 15 that tracks the reference signal 16 (i.e., output signal 15 tracks a phase and frequency of the reference signal 16). The PLL circuit 2 is referred to as "locked" when the output signal 15 tracks the phase and frequency of the reference signal 16.

Figure 2:
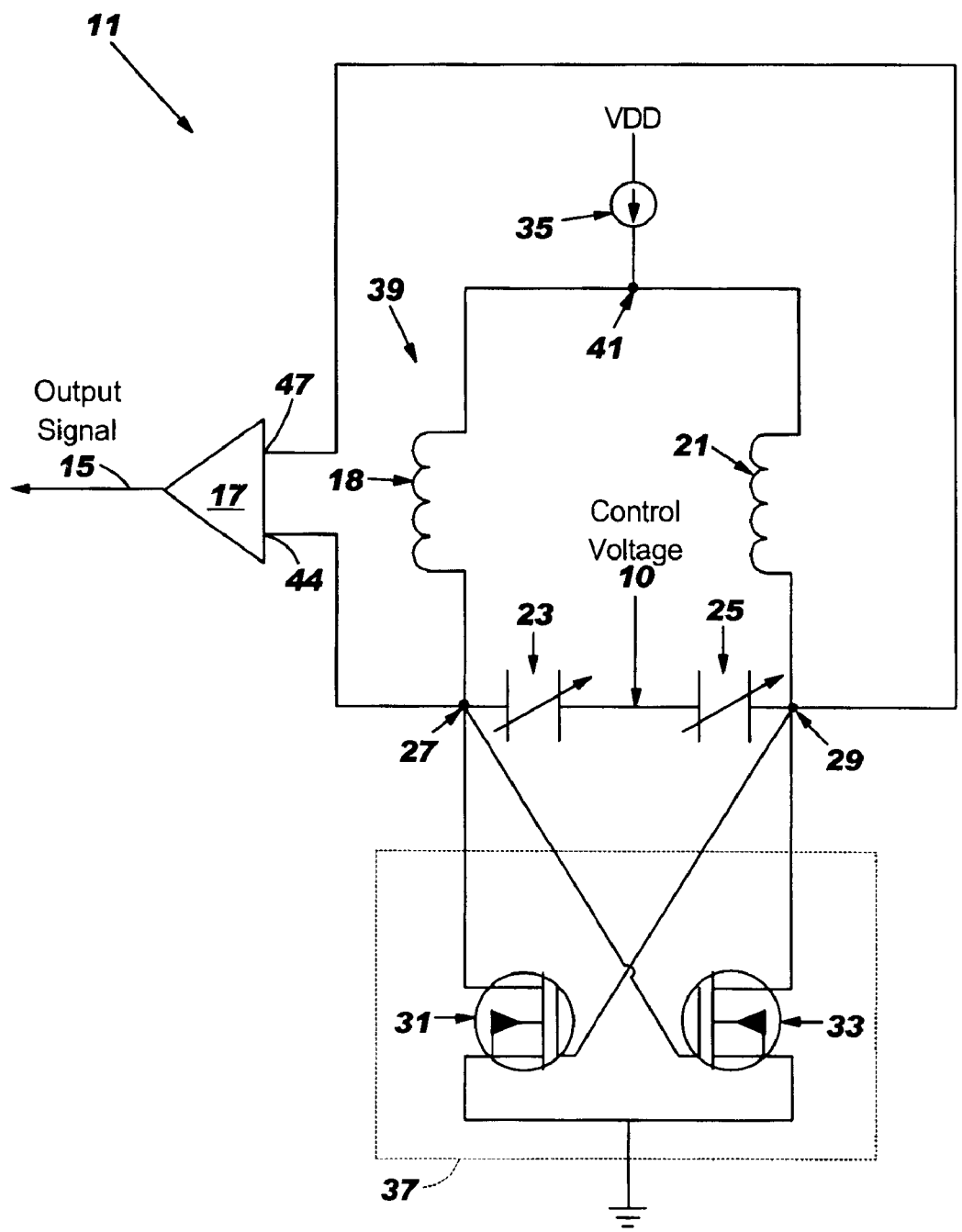
FIG. 2 illustrates an internal schematic of the VCO circuit of FIG. 1, in accordance with embodiments of the present invention.

FIG. 2 illustrates an internal schematic of the voltage controlled oscillator (VCO) circuit 11 of FIG. 1, in accordance with embodiments of the present invention. Note that although the VCO circuit 11 of FIGS. 1 and 2 is described with reference to the phase-locked loop (PLL) circuit 2 of FIG. 1, the VCO circuit 11 of FIGS. 1 and 2 may be used in any electrical circuit requiring a VCO known to a person of ordinary skill in the art such as, inter alia, communications circuits, servo circuits, etc. The VCO circuit 11 comprises an inductor/capacitor (LC) tank circuit 39, a drive circuit 37, and a comparator 17. The LC tank circuit 39 comprises, an inductor 18, an inductor 21, a varactor 23, and a varactor 25. The inductor 18 is electrically connected between the varactor 23 and the inductor 21. The varactor 25 is electrically connected between the inductor 21 and the varactor 23. The drive circuit 37 comprises transistor 31 and a transistor 33. The transistor 31 and the transistor 33 may each be any transistor known to a person of ordinary skill in the art such as, inter alia, a field effect transistor (FET), an n-channel FET, a p-channel FET, a bipolar transistor, etc. The transistor 31 is electrically connected to the transistor 33 between the inductor 21 and the varactor 25 at an oscillation node 29. Additionally, the transistor 33 is electrically connected to the transistor 31 between the inductor 18 and the varactor 23 at an oscillation node 27. A voltage VDD provides a supply voltage for the VCO circuit 11. The current source 35 provides a current supply for the VCO circuit 11. During operation of the VCO circuit 11, the transistor 31, the varacter 23, and the inductor 18 collectively produce a first voltage at the oscillation node 27 and the transistor 33, the varacter 25, and the inductor 21 collectively produce a second voltage at the oscillation node 29. The first voltage and the second voltage are oscillating voltages that oscillate out of phase from each other. A frequency of the first voltage and the second voltage is controlled by the control voltage 10. The first voltage is applied to a first input 44 of the comparator 17. The second voltage is applied to a second input 47 of the comparator 17. The comparator 17 compares the first voltage to the second voltage and produces the output signal 15 that tracks the phase and frequency of the reference signal 16 of the phase lock loop circuit 2 of FIG. 1. A third voltage at node 41 comprises an average voltage of the first voltage at node 27 and the second voltage at node 29. The third voltage should comprise a mid supply voltage (i.e., VDD/2). An amplitude of oscillation (i.e., amplitude of the first voltage and the second voltage) is controlled by the transistors 31 and 33. When the first voltage and the second voltage comprise a high frequency (e.g., a frequency greater than 2500 Mhz), the amplitude of oscillation may increase to a voltage level that is higher than the supply voltage VDD or decrease to a level that is lower than ground (i.e., negative voltage) thereby exceeding the voltage bounds of the supply voltage VDD. The amplitude of oscillation may exceed the voltage bounds of the supply voltage VDD because of a faster switching time of the transistor 31 and the transistor 33 caused by the high frequency. If the amplitude of oscillation exceeds the voltage bounds of the supply voltage VDD the following conditions may occur:

1. Assuming the transistor 31 and the transistor 33 are FETs, an oxide breakdown within the transistor 31 and the transistor 33 may occur thereby causing the transistor 31 and/or the transistor 33 to become damaged.

2. Assuming the transistor 31 and the transistor 33 are FETs, a forward bias of pn junctions within the transistor 31 and the transistor 33 may occur causing a CMOS latchup.

3. A changing amplitude of oscillation with a changing oscillation frequency may reduce a range of frequencies that the VCO 11 may attain.

The amplitude of oscillation should be limited to between the supply voltage VDD and ground to prevent the aforementioned conditions. A method to control an amplitude of oscillation is described in the description of FIG. 3, supra.

Figure 3:
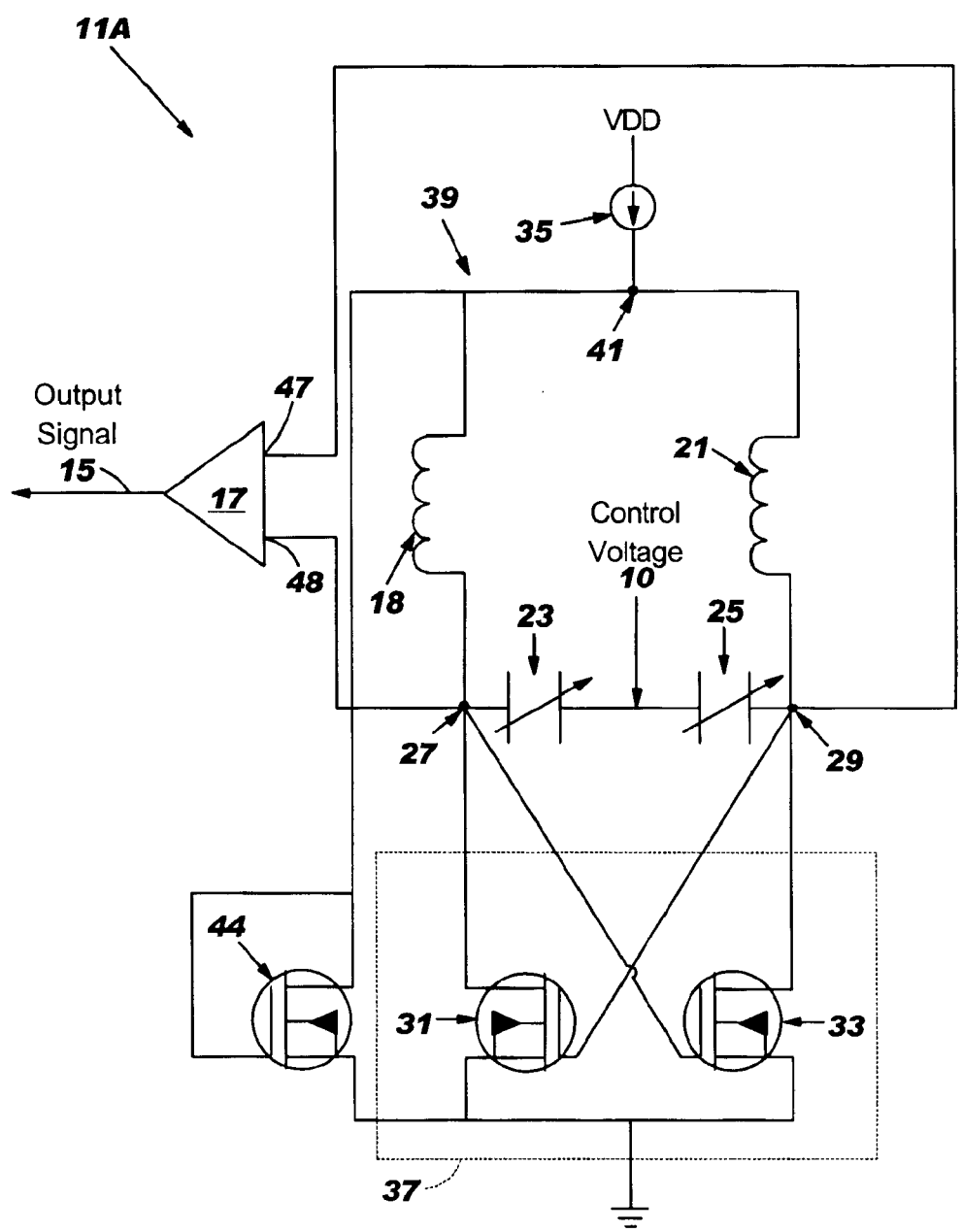
FIG. 3 illustrates a modified internal schematic of the VCO circuit of FIG. 2, in accordance with embodiments of the present invention.

FIG. 3 illustrates a modified internal schematic of the voltage controlled oscillator (VCO) circuit 11 of FIG. 2 represented by the VCO 11A, in accordance with embodiments of the present invention. Note that although the VCO circuit 11A of FIG. 3 is described with reference to the phase-locked loop (PLL) circuit 2 of FIG. 1, the VCO circuit 11A of FIG. 3 may be used in any electrical circuit requiring a VCO known to a person of ordinary skill in the art such as, inter alia, communications circuits, servo circuits, etc. In contrast with the VCO circuit 11 of FIG. 2, the VCO circuit 11A of FIG. 3 comprises a diode 44. The diode 44 in FIG. 3 comprises a FET (n-channel (NFET), p-channel FET (PFET), etc) with a gate electrically shouted to a drain such that the FET functions as a diode. Note that the diode 44 may comprise any diode known to a person of ordinary skill in the art. Additionally, the diode 44 may comprise a bipolar transistor with a base shorted to a collector such that the bipolar transistor functions as a diode. The diode 44 is electrically connected in parallel with the LC tank circuit 39 and the drive circuit 37. As the amplitude of oscillation of the first voltage at the first node 27 and the second voltage at the second node 29 increases or decreases, the third voltage at node 41 also increases or decreases accordingly. The diode 44 limits an amplitude of the first voltage and the second voltage by limiting an amplitude of the third voltage at node 41 (the third voltage is an average of the first voltage and the second voltage). The diode 44 limits an amplitude of the third voltage by shunting to ground any extra current away from the transistor 31 and the transistor 33. As the amplitude of oscillation increases, the third voltage on node 41 increases and the diode 44 conducts more current thereby reducing the amplitude of oscillation. Likewise, as the amplitude of oscillation decreases, the third voltage on node 41 decreases and the diode 44 conducts less current thereby increasing the amplitude of oscillation. During a temperature change to any of the circuitry within the VCO 11A (e.g. drive circuit 37, tank circuit 39, diode 44, etc.), the diode 44 maintains an about constant amplitude of oscillation. An about constant amplitude of oscillation is defined herein including in the claims as an amplitude that does not vary over time by more than 300 millivolts. Additionally, the diode 44 maintains an about constant amplitude of oscillation during a change of oscillation frequency or when the oscillation frequency comprises a high frequency (e.g., a frequency greater than 2500 Mhz). The nearly constant amplitude of oscillation is shown by the graph in FIG. 4 as described, supra.

Figure 4:
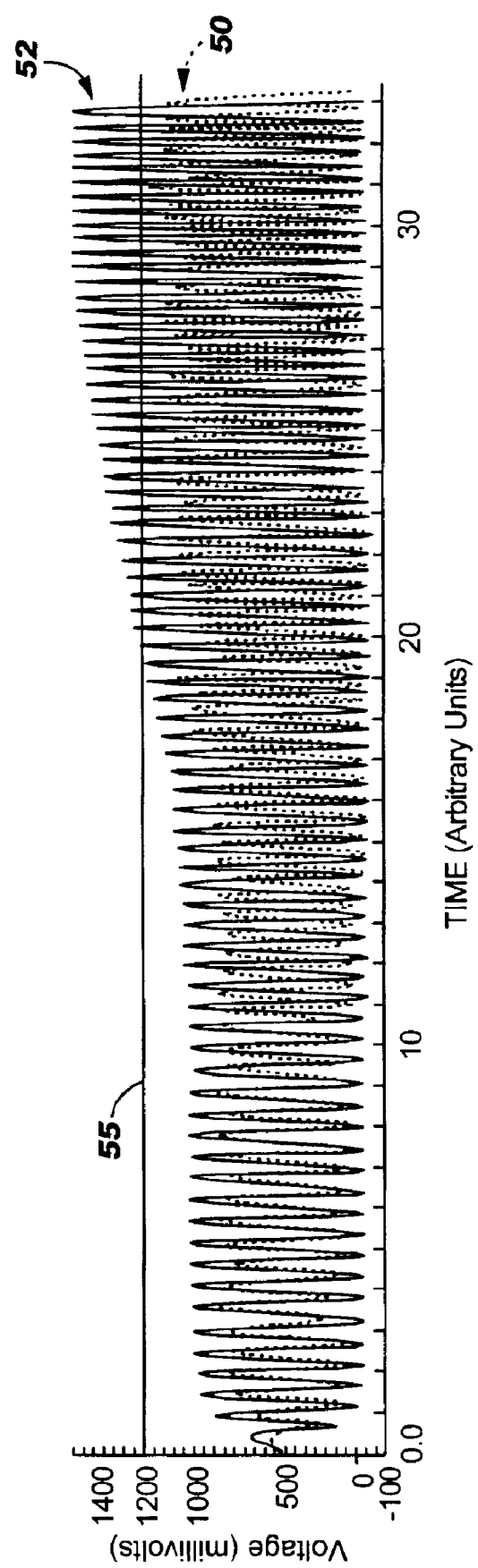
FIG. 4 illustrates a graph comparing a plot of an amplitude of oscillation with the amplitude control diode to a plot of an amplitude of oscillation without the amplitude control diode, in accordance with embodiments of the present invention.

FIG. 4 illustrates a graph comparing a plot 50 of an amplitude of oscillation with the diode 44 to a plot 52 of an amplitude of oscillation without the diode 44, in accordance with embodiments of the present invention. The X-axis represents time in arbitrary units. The Y-axis represents voltage in millivolts. The plot 55 represents a supply voltage VDD of 1200 millivolts. It can be seen from the plot 52 that the amplitude of oscillation rises above the supply voltage VDD 55 and below ground (less than 0 volts). Additionally, the plot 52 does not maintain an almost constant amplitude of oscillation (i.e., amplitude varies by more than 300 millivolts over time). It can be seen from the plot 50 that the amplitude of oscillation with the diode 44 stays within the voltage bounds of the supply voltage VDD (i.e., between VDD and ground). Additionally, the plot 50 does maintain an about constant amplitude of oscillation (i.e., amplitude does not vary by more than 300 millivolts over time).

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A voltage controlled oscillator circuit, comprising:

a drive circuit;

an inductor/capacitor (LC) tank circuit electrically connected to said drive circuit, the LC tank circuit and the drive circuit collectively comprising a first oscillating node and a second oscillating node, the first oscillating node being adapted to have a first voltage, the second oscillating node being adapted to have a second voltage; and a diode electrically connected to and in parallel with the LC tank circuit and the drive circuit, wherein said diode is adapted to control an amplitude of the first voltage and an amplitude of the second voltage.

2. A voltage controlled oscillator circuit comprising:

a drive circuit;

an inductor/capacitor (LC) tank circuit electrically connected to said drive circuit, the LC tank circuit and the drive circuit collectively comprising a first oscillating node and a second oscillating node, the first oscillating node being adapted to have a first voltage, the second oscillating node, being adapted to have a second voltage; and a diode electrically connected to the LC tank circuit and the drive circuit, the diode adapted to control an amplitude of the first voltage and an amplitude of the second voltage wherein the diode comprises a field effect transistor (FET) with a gate electrically shorted to a drain.

3. The voltage controlled oscillator circuit of claim 2, wherein the FET is an n-channel FET (NFET).

4. The voltage controlled oscillator circuit of claim 2, wherein the diode is further adapted to maintain an amplitude of the first voltage that is about constant over time and an amplitude of the second voltage that is about constant over time.

5. The voltage controlled oscillator circuit of claim 2, further comprising a comparator adapted to compare the first voltage to the second voltage, wherein the voltage controlled oscillator circuit is within a phase-locked loop circuit, arid wherein the comparator is further adapted to provide an output signal that tracks a phase and frequency of a reference signal for the phase-locked loop circuit.

6. The voltage controlled oscillator circuit of claim 2, wherein the diode is further adapted to limit the amplitude of the first voltage to within a range between a supply voltage of the voltage controlled oscillator circuit and a ground voltage, and wherein the diode is adapted to limit the amplitude of the second voltage to within a range between the supply voltage of the voltage controlled oscillator circuit and the ground voltage.

7. The voltage controlled oscillator circuit of claim 6, wherein the diode is further adapted to increase the amplitude of the first voltage, and wherein the diode is adapted to increase the amplitude of the second voltage.

8. The voltage controlled oscillator circuit of claim 6, wherein the diode is further adapted to decrease the amplitude of the first voltage, and wherein the diode is adapted to decrease the amplitude of the second voltage.

9. The voltage controlled oscillator circuit of claim 6, further comprising a current source adapted to provide a shared current flow for the LC tank circuit, the drive circuit, and the diode, wherein the diode is adapted shunt a portion of the current flow away from the LC tank circuit through the diode to ground.

10. A method, comprising:

providing a drive circuit electrically connected to an inductor/capacitance (LC) tank circuit and a diode within a voltage controlled oscillator circuit, the diode electrically connected to and in parallel with the LC tank circuit and the drive circuit, the drive circuit and LC tank circuit collectively comprising a first oscillating node and a second oscillating node; and controlling by the diode, an amplitude of a first voltage at the first oscillating node and an amplitude of a second voltage at the second oscillating node.

11. A method, comprising:

providing a drive circuit electrically connected to an inductor/capacitance (LC) tank circuit diode within a voltage controlled oscillator circuit, the diode electrically connected to the LC tank circuit and the drive circuit, the drive circuit and LC tank circuit collectively comprising a first oscillating node and a second oscillating node;

electrically shorting a gato of a field effect transistor FET to a drain of the FET such that the FET functions as the diode; and controlling by the diode, an amplitude of a first voltage at the first oscillating node and an amplitude of a second voltage at the second oscillating node.

12. The method of claim 11, further comprising:

providing a comparator within the voltage controlled oscillator, wherein the voltage controlled oscillator circuit is within a phase-locked loop circuit;

comparing by the comparator, the first voltage to the second voltage; and providing by the comparator, an output signal that tracks a phase and frequency of a reference signal for the phase-locked loop circuit.

13. The method of claim 11, wherein the FET is an n-channel FET (NFET).

14. The method of claim 11, further comprising maintaining by the diode, an amplitude of the first voltage that is about constant over time and an amplitude of the second voltage that is about constant over time.

15. The method of claim 14, further comprising:

limiting by the diode, a range of the amplitude of the first voltage between a supply voltage of the voltage controlled oscillator circuit and a ground voltage; and limiting by the diode, a range of the amplitude of the second voltage between the supply voltage of the voltage controlled oscillator circuit and the ground voltage.

16. The method of claim 15, further comprising:

providing a current source; and providing by the current source, a shared current flow for the LC tank circuit, the drive circuit, and the diode, wherein said limiting by the diode comprises shunting by the diode, a portion of the current flow away from the LC tank circuit and the drive circuit through the diode to ground.

17. The method of claim 15, further comprising:

increasing by the diode, the amplitude of the first voltage; and increasing by the diode, the amplitude of the second voltage.

18. The method of claim 15, further comprising:

decreasing by the FET, the amplitude of the first voltage; and decreasing by the FET, the amplitude of the second voltage.

* * * * *